United States Patent [19]

Meyer

[11] 3,940,635

[45] Feb. 24, 1976

[54] SELF-DAMPING CIRCUIT

[75] Inventor: Albert Meyer, Deer Park, Ohio

[73] Assignee: D. H. Baldwin Company, Cincinnati, Ohio

[22] Filed: Aug. 29, 1974

[21] Appl. No.: 501,747

[52] U.S. Cl. .................. 307/294; 84/1.13; 84/1.26; 307/261; 307/263

[51] Int. Cl.[2] ...................... G10H 1/02; H03K 17/26

[58] Field of Search ............ 84/1.13, 1.26, DIG. 23; 307/260, 261, 263, 294

[56] References Cited

UNITED STATES PATENTS

| | | | |
|---|---|---|---|
| 3,247,306 | 4/1966 | Milho | 84/1.13 |
| 3,383,453 | 5/1968 | Sharp | 84/1.26 |
| 3,417,189 | 12/1968 | Kramer, Jr. | 84/1.26 X |
| 3,636,801 | 1/1972 | Ickikawa | 84/1.13 |
| 3,816,636 | 6/1974 | Peltz | 84/1.13 X |
| 3,825,668 | 7/1974 | Okamoto | 84/1.13 X |
| 3,848,142 | 11/1974 | Adachi | 307/294 |

*Primary Examiner*—Stephen J. Tomsky
*Assistant Examiner*—Stanley J. Witkowski
*Attorney, Agent, or Firm*—Hyman Hurvitz

[57] ABSTRACT

A Zimbelstern system or sequential bell ringing system in which a sequential counter actuates a set of self-damping circuits in a predetermined repeating sequence, the self-damping circuits each enabling a different set of sinusoidal tone sources in such relative amplitudes and with such relative rise and decay envelopes as to simulate the sounds of sequentially sounding bells when electro-acoustically reproduced.

6 Claims, 4 Drawing Figures

SELF-DAMPING CIRCUIT

BACKGROUND OF THE INVENTION

It is known in the prior art to actuate a set of diverse bells sequentially and mechanically as an accessory to pipe organs. Such a device is called a Zimbelstern. Usually at least four diverse bells are employed and these are struck in a predetermined sequence which is continually repeated for as long as is desired. Assuming the use of four bells, the sequence of bells may repeat only after eight bell sounds have been completed. A typical sequence might be, for Example, G5, G6, B5, G5, D6, B5, G6, D6, the nomenclatures representing the fundamentals of the bell tones. Each bell tone represents a combination of partials and each partial requires its own relative amplitude and rise and decay wave envelope.

It is an object of the present invention to simulate electronically the sounds and tonal patterns of a Zimbelstern employing bells, and to provide a novel self-damping circuit which can be employed in a Zimbelstern.

SUMMARY OF THE INVENTION

An electronic Zimbelstern system, in which a ring of eight one-shot multivibrators applies pulses in a prearranged sequence to four sets of four self-damping wave shaping circuits, the latter keying on sinusoidal tone signal sources in relative amplitudes and which rise and decay rates which are appropriate to produce the sounds of four bells of different fundamental frequencies and associated partials.

DETAILED DISCLOSURE OF THE INVENTION

Figure 1:
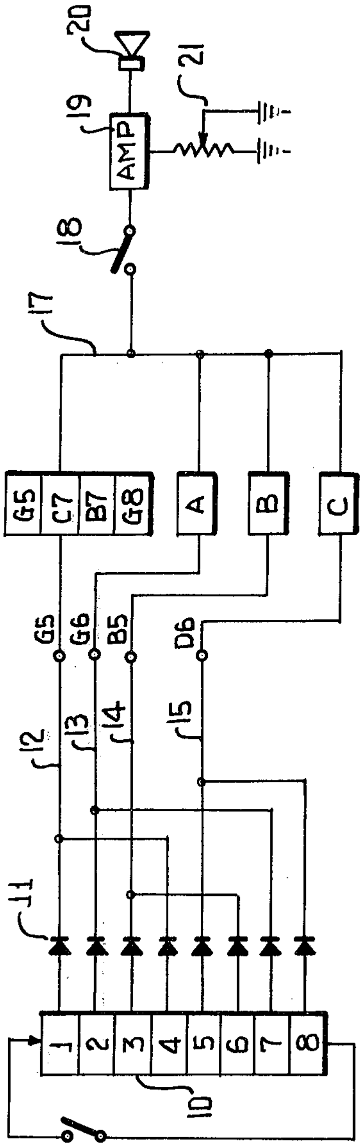
FIG. 1 is a block diagram of a system according to the present invention

Referring to FIG. 1 of the drawings, 10 is a block diagram of a ring counter oscillator having eight stages, each of which is a mono-stable multivibrator having a pulse which provides a total oscillation period of 1.5 seconds. The output of each multivibrator proceeds via a diode 11 to an output lead, as 12. The eight stages of ring counter 10 proceed to four output leads 12, 13, 14, 15, stages 1 and 4 proceeding to lead 12, stages 2 and 7 to lead 13, stages 3 and 6 to lead 14, and stages 5 and 8 to lead 15. The leads 12, 13, 14, 15 are labelled with the fundamentals of the bell tones appertaining to the leads, respectively; i.e., G5, G6, B5, D6. The sequence in which the bells will sound, for the interconnections provided is G5, G6, B5, G5, D6, B5, G6, D6.

Each of leads 12–15 inclusive, proceeds to a set of electronic gates G5, C7, B7, G8, A, B, C, which gate through, respectively, a set of sinusoidal oscillations which provide the partials of a bell sound. The gates are controlled respectively by wave shapers each providing a gating wave appropriate to a partial of a particular composite bell tone signal. For example, the pulse applied on lead 21 is concurrently shaped in four wave shapers associated with gates and tone signal sources labelled G5, C7, B7 and G8, which forms the G5 bell tone. The outputs of all the gates are collected on a common bus 17, and the latter is connected via an on-off switch 18, which leads to a power amplifier 19 and loud speaker 20, the power amplifier 19 being subject to gain control by a conventional foot operated expression device 21.

Figure 2:
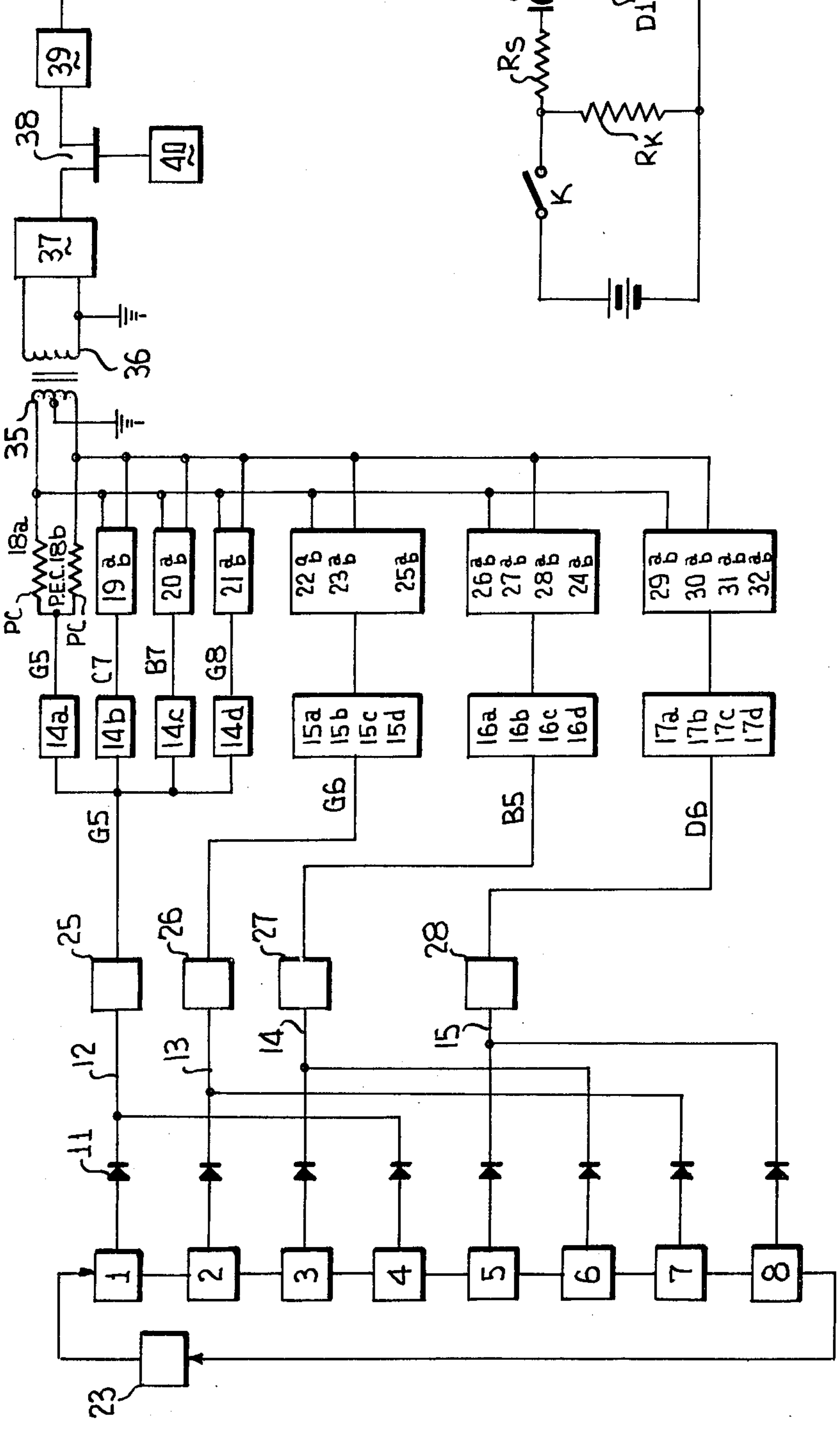
FIG. 2 is a block diagram of a modification of the system of FIG. 1, as applied in a photo-electric organ.

In the system of FIG. 2, 23 is a transistor switch having slow closure and opening times in response to a stop switch closure. The output of mono-stable multivibrator stage 8 is connected to the input of stage 1 via the transistor switch 23, so that the counter 10 runs through a sequence from 1 to 8 in a given time, about 1.5 seconds.

The function of the steering diodes 11 has been explained. The leads 12–15, respectively, are connected via amplifiers 25–28 to sets of self-damping circuits 14*a*–14*d*, 15*a*–15*d*, 16*a*–16*d*, and 17*a*–17*d*, each appropriate to one partial of a bell sound, according to the following table:

14*a*-G5
14*b*-C7
14*c*-B7
14*d*-G8
15*a*-G6
15*b*-C8
15*c*-B8
15*d*-F9
16*a*-B5
16*b*-E7
16*c*-D 8
16*d*-B8
17*a*-D6
17*b*-G7
17*c*-F 8
17*d*-D9

The wave form provided by damping circuit 14a is applied in parallel to a pair of photo-resistive cells, 18a, 18b which lead to opposite ends of a ground center-tapped primary winding 35. The photo cells are illuminated, as in conventional photo-electric organs, by a series of moving slots which scan two variable area sinusoidal optical wave forms, of the same wave lengths, but phased apart by 180 electrical degrees, the scanning rate and the physical dimensions of the optical wave forms being selected to provide in primary winding 35 a desired frequency, whereas dc currents in the photo cells cancel. The secondary winding 36, which is single ended, sees only an ac signal of the proper frequency, which drives a pre-amplifier 37. A FET on-off switch 38 is provided between pre-amplifier 37 and line amplifier 39, the FET being controlled by a manual switch 40. Line amplifier 39 drives power amplifier 41 and loud speaker 42.

The essential differences between the systems of FIGS. 1 and 2 relate then to the use of photo-electric tone sources in the system of FIG. 2 and of electric tone sources and associated gates in the system of FIG. 1. The present system is applicable to any type of electronic organ. For example, each tone partial may be provided by an oscillator of appropriate frequency which is supplied with operating voltage from the self-damping circuits 14*a*–14*d*, etc., or from amplified versions of these.

Figure 3A:
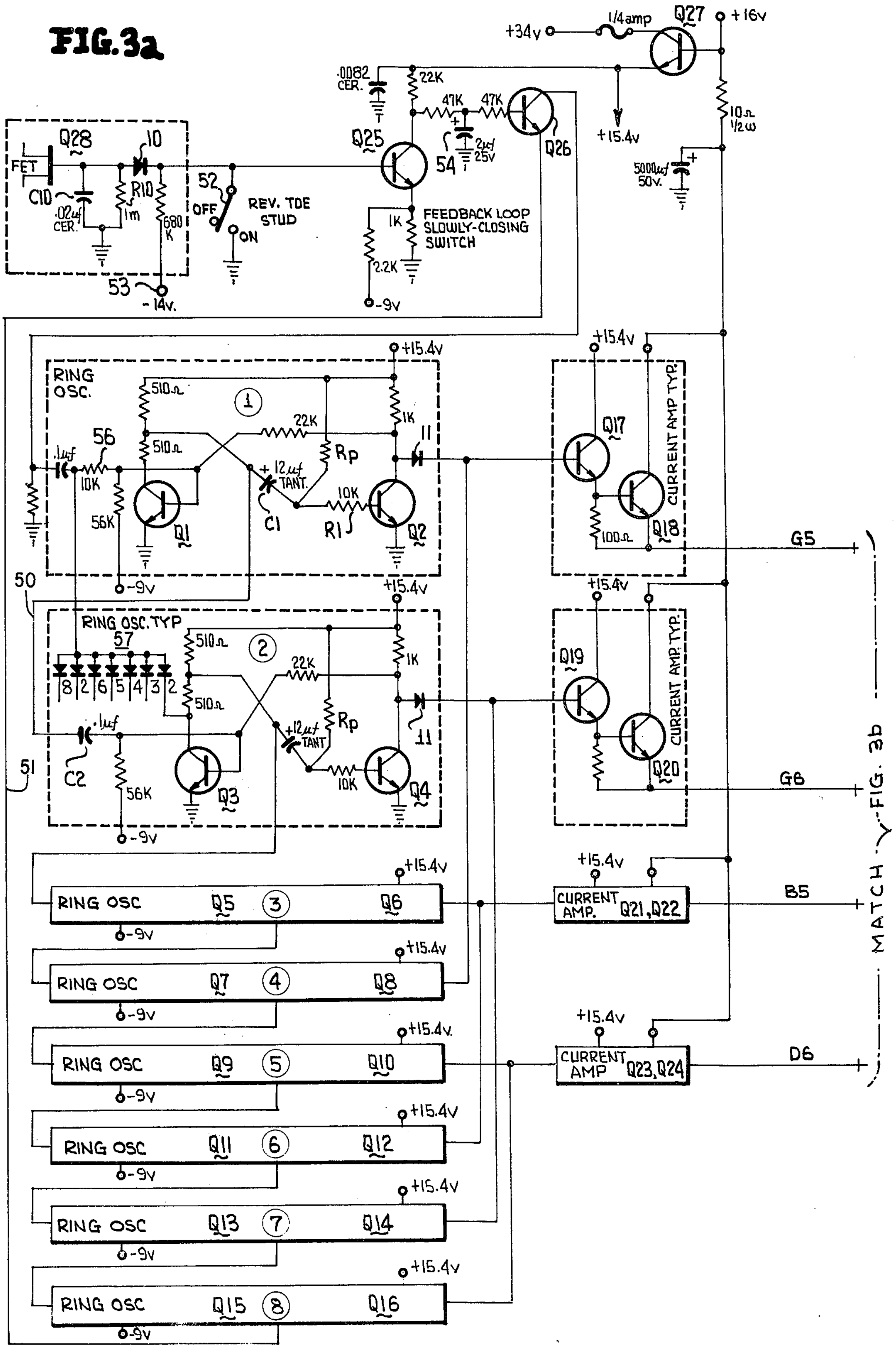
FIGS. 3*a* and 3*b* is a circuit diagram of a portion of the system of FIGS. 1 and 2.

Referring now to FIG. 3a of the accompanying drawings, NPN transistors Q1, Q2 are intercoupled as a conventional monostable multivibrator 1, there being an $R_1C_1$ connection from a point of the collector load circuit of Q1 to the base of Q2 and a resistive connection from the collector of Q2 to the base of Q1. From the collector circuit of Q1, a lead 50 proceeds via a dc blocking ac coupling capacitor C2 to the base of a further NPN transistor Q3, which is cross coupled to an NPN transistor Q4 to form a second mono-stable multivibrator 2. A total of eight such multivibrators is provided in a chain, the last stage of which is connected back, via lead 51 to the emitter of PNP transistor Q26, the collector of which is capacitively coupled to the base of Q1. So long as Q26 is fully on it has no effect on the operation of the system other than to complete the oscillator loop.

The system is started in operation by actuating switch 52 to ON position, which grounds the base of normally off NPN transistor Q25, rendering the latter conductive by changing its base voltage from −14V, at terminal 53, to about 0.V. The emitter of Q25 is held at about −3V. When Q25 becomes conductive, it transfers a negatively going pulse to the base of Q26 via a low pass filter 54, slowly turning on Q26. The latter then remains on while switch 52 is on. If switch 52 is transiently turned off, however, Q26 will remain on for a time, so that the continuous recycling of the mono-stables is not interrupted. The effect of bouncing of the contacts of switch 52 is thus obviated, in one respect, i.e., accidental or unintended interruption of the oscillator formed by the eight mono-stables.

A further problem exists in that unintended pulses may be introduced from external sources of noise, or by successive closures of switch 52 at intervals sufficiently long that Q26 has had time to open and close. In either case, plural mono-stables may be concurrently on, and plural bell sounds may then occur concurrently in an undesirable sequence. Once this has occurred, it can only be terminated by permitting the sequence of eight bell sounds to terminate. If the termination occurs while Q26 is off, the sequence will not be re-initiated. If Q26 remains closed, however, plural pulses will concurrently circulate around the array of monostables and will continue to circulate.

To the base of Q1, via a resistance 56, is connected in parallel to the anodes of seven diodes 57. The cathodes of these diodes 57 proceed respectively to the collectors of succeeding transistors Q3, Q5 . . . . Diode 57-2, for example, has its cathode grounded via Q3, when Q3 is on, which holds the base of Q1 near ground and therefore prevents operation of Q1 or of the mono-stable 1. It follows that upon completion of a cycle of operation, mono-stable 1 cannot re-operate to initiate a new cycle if any other mono-stable other than 1 is operating at that time.

The outputs of the mono-stables proceed via diodes 11, and via current amplifiers of the Darlington configuration, composed of transistors Q17, Q18, into wave shapers 14*a*–14*d*, 15*a*–15*d*, 16*a*–16*d*, 17*a*–17*d*. While the several wave shapers are individually designed in respect to R and C values, each to provide its individual output wave shape, the circuit configurations and modes of operation are generally identical (except that 16*d* and 15*c* share a common load resistor).

Describing the wave shaping circuit 14a, as typical, a pulse applied to lead 60 charges capacitors C5 and C6 in series, via resistance R5, C5 and C6 being separated by diode D5. The rise of potential across C6 is relatively rapid. Upon termination of the input pulse on lead 60, capacitors C5 and C6 are charged, but commence to discharge. C5 discharges via R5, resistance R6, and diode D6, with the time constant (R5+R6)C5. C6 discharges through resistances R7, R8. Charge time of C6 (and also C5) is relatively rapid since R7 is rather large compared to R5, and discharge of C6, which proceeds concurrently with charging via R5, is slow. Discharge is slow, occurring from C6 alone, via R7 and R8 in series. When the input pulse to line 60 falls to zero, discharge of C5 is rapid and does not affect discharge of C6, because of the isolating action of D5.

Wave shaper 16*d* is different in configuration from the others in that a further diode D7 is included through which capacitor C6*a* can discharge through resistance R8*a* of wave shaper 15*c*. Since R8*a* sees two distinct discharges, the output wave shape at terminal B8 is not a single exponential curve, but a time succession of two different exponentials, deriving from C6*a* and C6b.

While the present system employs a chain of monostables, it is also feasible to employ a clock plus a chain of eight bistable flip-flops, to form a commutator counter, or in any other manner known in the art to provide a sequence of pulses.

When stop switch 52 is closed, the cathode of diode D10 is grounded, it being normally held at −14V by the voltage on terminal 53. The FET Q28, normally maintained non-conducted by the −14V, is then turned on, this FET corresponding with FET 38 of FIG. 2, switch 40 of FIG. 2 corresponding with switch 52 of FIG. 3*a*. The capacitor C10 and resistor R10 provides a delayed cut-off of FET Q28 when switch 52 is opened.

Figure 4:
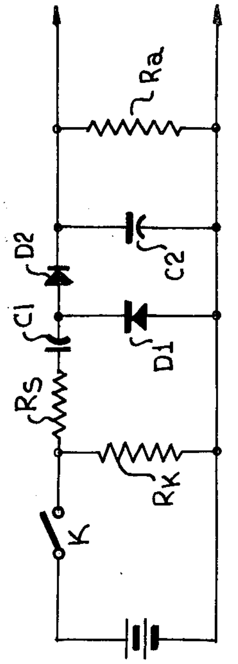
FIG. 4 is a circuit diagram of a key-operated self-damping circuit.

In FIG. 4, the effect of inserting a pulse into a self-damping circuit is simulated by providing a voltage source 60 and a key switch K. The system of FIG. 4 may be utilized to control percussive instruments, i.e., bells, gongs, chimes, piano and harpsichord. These produce tones which decay away regardless of the player's action after he has struck the key and thus closed the key switch K.

There are organ compositions which use chimes along with organ voices in a monophonic legato melody line. Hence, if the organ has tubular chimes the composers intent is realized — the organ solo melody is legato (connected) with accent or punctuation from the percussive chime tones. Obviously, in an organ having electronic chimes which, perforce, must be played momentarily, or with the circuit of FIG. 4, one cannot properly realize the composer's intent because the accompanying organ voice might be played staccato or legato. The self-damping keying circuit of FIG. 4 makes it possible to use conventional playing techniques. Technically, this is because the network does not transmit dc, so even if key switch K is held closed indefinitely, the controlled audio will decay. In fact, there is a measure of performer control because the decay time constant, for the switch held closed, is different (longer) from that for momentary playing. Thus, a sort of damper effect takes place when the key is released.

For the above circuit, wherein Rs is relatively small, the following approximate equations hold: Referring to FIG. 4, the following conditions obtain:

| | | | |
|---|---|---|---|
| I | Key held closed | Decay time constant | $TF_c = Ra(C1+C2)$ |
| II | Key momentary | Decay time constant | $TF_o = RaC2$ |
| III | | Rise time constant | $TR = Rs\frac{C1C2}{C1+C2}$ |

Diode D2 is the reason for the difference between Equation I and Equation II. In case I it conducts at all times, whereas in case II it forces the discharge of C2 only into Ra. Diode D1 allows C1 to disengage so that the tone can be repeated. The discharge path includes Rk which should be sufficiently large that it does not draw too much current from the DC supply, or damage key switch K.

Obviously, the above damper effect can be varied by properly proportioning the capacitor values.

$$\text{IV} \quad \frac{TFc}{TFo} = \frac{C1 + C2}{C2} = 1 + \frac{C1}{C2}$$

As shown here, the larger C1 becomes, the greater the ratio of time constants, i.e., the greater the damper effect when the key is released. The peak output voltage of the circuit is, of course, a function of this same capacitance ratio (for Rs negligibly small). As shown here the peak output is V Normalized indicial response, i.e., response to a dc unit pulse at zero time, $$A(o) = \frac{C1}{C1 + C2} = \frac{\frac{C1}{C2}}{1 + \frac{C1}{C2}}$$

and becomes greater as the time constant ratio above becomes greater. Because finite, non-zero rise times are desired (Rs O) the peak output voltage is somewhat less than the indicial response given in IV. If C1 = C2, yielding $$\frac{TFc}{TFo} = 2,$$

there results a pleasantly noticeable effect.

The self damping circuits of FIGS. 3 and 4 differ only in that in FIG. 4 a manually controlled key K is included to control the durations of dc input, whereas in FIG. 3 the dc inputs are repetitive pulses. In FIG. 3 the time constants involved provide for essentially total decays of output from each of the self damping circuits in the periods between applied pulses. In the system of FIG. 4, the key K may be so manipulated as to enable legato playing.

Figure 3B:
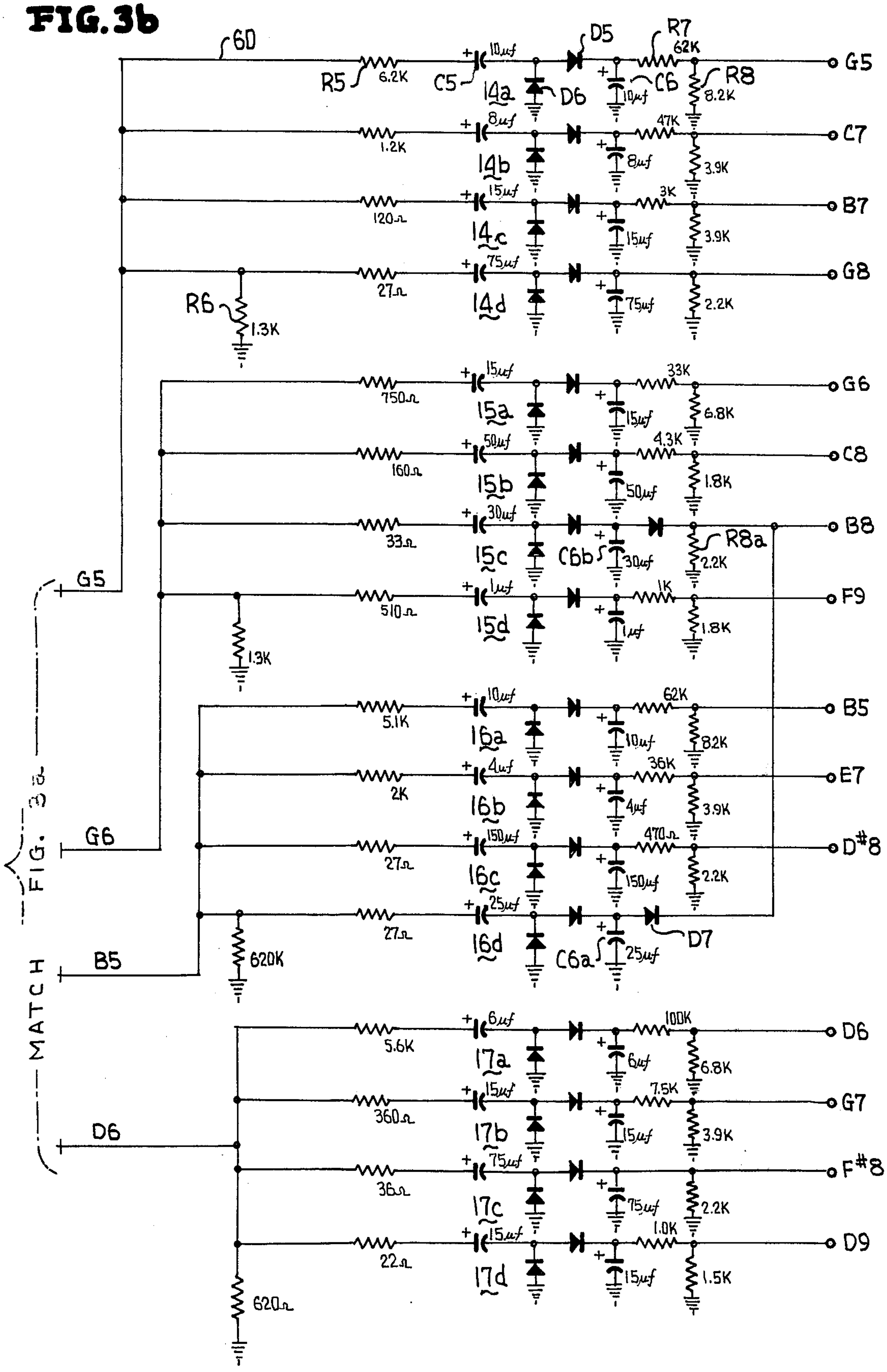

In the system of FIGS. 3a and 3b which is applied to a conventional photo-electric organ, the photo-cell circuits act essentially as gates for optically applied sinusoidal signals. However, the system of FIG. 3 is applicable to organs employing diode or transistor gates, gating signals derived from sinusoidal tone sources, or the tone signals may be derived from self-oscillators powered by the self decaying circuits.

Equations II, III, IV, V apply to the system of FIG. 3, as well as to the system of FIG. 4, assuming in all cases that $R_K$ is so small, in FIG. 4, as to negligibly affect time constants. R5 of FIG. 3 then equates with $R_K$ of FIG. 4.

What is claimed:

1. A self-decay circuit, including a source of a dc voltage pulse, a resistance (Rk) connected across said source, a series circuit consisting of a first resistance (Rs) and a first capacitance (C1), a first diode (D2) poled to be conductive to said dc voltage pulse, a partial circuit consisting of a second resistance (Ra) and a second capacitance (C2), means connecting said series circuit, said first diode and said parallel circuit all in series in the order stated across said resistance (Rk), and a second diode connected in a series circuit and poled to discharge said first capacitance after termination of said dc voltage pulse, said first diode being poled to be conductive of current in response to said dc voltage pulse, said first and second resistances Rs and Ra being the sole resistances connected in series with said first capacitance (C1).

2. The combination according to claim 1, wherein said first resistance is substantial but relatively small and said second resistance is relatively large, and wherein said first and second capacitances are of the same order of magnitude.

3. A self-decay circuit, including a source of terminable dc voltage, a resistance (Rk) connected in series across said source of dc voltage, a series circuit consisting of first resistance (Rs) and first capacitance (C1) in series with each other, a first diode (D2), a parallel circuit consisting of second resistance (Ra) and second capacitance (C2), means connecting said series circuit and said first diode and said parallel circuit in the order recited all in a series circuit including said source of dc voltage, and a second diode (D1) connected across said resistance (Rk) and said series circuit taken in series with each other, said second diode being poled to discharge said first capacitance on termination of said dc voltage, said first diode being poled to be conductive in response to said dc voltage.

4. The combination according to claim 3, wherein the resistance of said series circuit is substantial but relatively small and the resistance of said parallel circuit is relatively large, said first and second capacitances and said resistances having values establishing a relatively rapid exponential rise and a relatively slow exponential fall across the resistance of said parallel circuit, and wherein said first and second capacitances are substantially equal.

5. The combination according to claim 4, wherein said source of terminable dc voltage is a source of periodic dc voltage pulses.

6. The combination according to claim 5, wherein the rise time constant of said self-decay circuit is $$Rs \frac{C1C2}{C1+C2}$$

and wherein the decay time constant of said self decay circuit is RaC2 in response to each of said pulses.

* * * * *